US007233673B1

(12) United States Patent
Poletti

(10) Patent No.: US 7,233,673 B1
(45) Date of Patent: Jun. 19, 2007

(54) IN-LINE EARLY REFLECTION ENHANCEMENT SYSTEM FOR ENHANCING ACOUSTICS

(75) Inventor: Mark Poletti, Wellington (NZ)

(73) Assignee: Industrial Research Limited, Lower Hutt (NZ)

( * ) Notice: Subject to any disclaimer, the term of this patent is extended or adjusted under 35 U.S.C. 154(b) by 0 days.

(21) Appl. No.: 09/673,808

(22) PCT Filed: Apr. 23, 1999

(86) PCT No.: PCT/NZ99/00049

§ 371 (c)(1),
(2), (4) Date: Jan. 12, 2001

(87) PCT Pub. No.: WO99/54867

PCT Pub. Date: Oct. 28, 1999

(30) Foreign Application Priority Data

Apr. 23, 1998 (NZ) ..................................... 330268

(51) Int. Cl.
*H03G 3/00* (2006.01)

(52) U.S. Cl. .......................................... 381/63; 84/630

(58) Field of Classification Search ............ 381/61–65, 381/17–18; 84/630
See application file for complete search history.

(56) References Cited

U.S. PATENT DOCUMENTS

| | | | | | |
|---|---|---|---|---|---|
| 5,440,639 | A | * | 8/1995 | Suzuki et al. | 381/17 |
| 5,555,306 | A | * | 9/1996 | Gerzon | 381/63 |
| 5,729,613 | A | * | 3/1998 | Poletti | 381/63 |
| 5,812,674 | A | * | 9/1998 | Jot et al. | 381/17 |
| 5,862,233 | A | * | 1/1999 | Poletti | 381/63 |

FOREIGN PATENT DOCUMENTS

WO WO 9323847 A1 * 11/1993

OTHER PUBLICATIONS en.wikipedia.org/wiki/Orthonormal_matirx.*

* cited by examiner

*Primary Examiner*—Vivian Chin
*Assistant Examiner*—Corey Chau
(74) *Attorney, Agent, or Firm*—Dann, Dorfman, Herrell and Skillman, P.C.

(57) ABSTRACT

An in-line early enhancement generation system comprises one or more microphones positioned close to one or more sound sources so as to detect predominantly direct sound, an early reflection generation stage which generates a number of delayed reproductions of the microphone signals and which has unitary power gain whereby the stability of the system is independent of the delay times and amplitudes, and a number of loudspeakers placed to broadcast said early reflected energy into the room.

16 Claims, 4 Drawing Sheets

IN-LINE EARLY REFLECTION ENHANCEMENT SYSTEM FOR ENHANCING ACOUSTICS

TECHNICAL FIELD

The invention comprises an in-line early reflection enhancement system and method for enhancing the acoustics of a room or auditorium.

BACKGROUND

The acoustics of a room has a significant impact on an audience's perception of the quality of a live performance. There are a number of properties of rooms that have been identified as being correlated to subjective impressions of quality. The earliest measured parameter was the reverberation time. This is a global property of the room which has a similar value at all locations. It is governed by the room volume and the absorption of the room surfaces, and the quality of reverberation is also governed by the room shape. Rooms with a long reverberation time can provide a sense of envelopment which produces an increased enjoyment of performances such as opera or classical music. However, the same acoustics can reduce the intelligibility of the spoken word, and therefore be unsuitable for speech.

Other parameters have been determined which relate to the properties of the early part of the response, such as the clarity. More recent auditoria have been designed with reflectors specifically placed to enhance the early part of the room response to sounds emanating from the stage.

To achieve maximum enjoyment of a variety of performances, the acoustics of a room must be matched to the intended performance. Many rooms have for this reason been made acoustically adjustable. For example adjustable absorbers such as moveable curtains or rotatable panels have been used to control reverberation time. Extra acoustic spaces have been constructed which can be coupled to the main area when required to provide more reverberance.

Electroacoustic systems have been used for many years to enhance the acoustics of rooms. The simplest system is the public address or sound reinforcement system, in which the sound produced by performers on stage is detected by close microphones and the sound amplified and broadcast from one or more sets of loudspeakers. The goal of such systems is typically to project the direct, unreverberated, sound to the audience to eliminate the effects of the room and improve clarity.

More recently, more complex forms of sound system have been developed which aim to provide adjustable room acoustics. The basic sound reinforcement system has been further developed by introducing sound processing elements such as delays, which allow the creation of additional sound reflections—see W. Anhert, "Complex simulation of acoustic fields by the delta stereophony system (DDS)," *J. Audio Eng: Soc.*, vol. 35, no. 9, pp 643-652, September 1987, and U.S. Pat. No. 5,142,586. The delta stereophony system described by Anhert provides sound reflections that are arranged to arrive later than the direct sound, in order to maintain correct localisation. For a given receiver location, the appropriate delays can be chosen to avoid preceding the direct sound, but the delays must be changed for different receiver positions. The ACS system described in U.S. Pat. No. 5,142,586 claims to provide reflections at the appropriate times for all receiver positions, by the creation of wavefronts. The delays are chosen using Huygens principle, and their quantification mathematically by integral equations is described by A. J. Berknout, D. de Vries, and P. Vogel, "Acoustic control by wave field synthesis," *J. Acoust Soc. Am*, vol. 93, no. 5, pp 2764-2778, May 1993. The wavefronts are generated using loudspeaker arrays. These electroacoustic systems offer a more controllable early reflection response than can be achieved using passive reflectors.

Reverberators have also been introduced to provide a larger reverberation time for sources on stage—see for example U.S. Pat. No. 5,109,419. Larger numbers of speakers have also been employed to provide enhanced reflections and reverberation, such as to under balcony areas. The microphones have also been positioned further from the performers so as to be less obtrusive, while still aiming to detect the direct sound.

The systems discussed above avoid feedback from the loudspeakers to the microphones, since such feedback can lead to colouration and instability if the loop gain is too high. Because of this fact, they may be generically termed in-line, or non-regenerative, systems. Such systems can provide large increases in reverberation for sound sources that are close to the microphones (ie on stage), but they have a small effect for sound sources at other positions in the room.

A second type of enhancement system is the non-in-line, or regenerative, system, which seeks to utilise the feedback between loudspeakers and microphones to achieve a global enhancement of reverberation that occurs for any sound source position—see A. Krokstad, "Electroacoustic means of controlling auditorium acoustics," *Applied Acoustics*, vol. 24, pp 275-288, 1998 and F. Kawakami and Y. Shimizu, "Active field control in auditoria," *Applied Acoustics*, vol. 31, pp 47-75, 1990. Since the natural, unassisted reverberation time is largely the same for all source positions, the regenerative systems can provide a more natural enhanced reverberation. Non-in-line systems typically use a large number of independent microphone, amplifier, loudspeaker channels, each with a low loop gain. Each channel provides a small enhancement of reverberation at all frequencies, with low risk of colouration, and the combined effect of all the channels is a significant increase in reverberation and loudness. The microphones are positioned in the reverberant field from all sound sources in the room to ensure that the system produces a similar enhancement for all sources. Non-in-line systems, however, have typically required from 60 to 120 channels, and have therefore been expensive. Furthermore, since the microphones are remote from all sources, they are less suited to providing significant early reflections than in-line systems.

More recently, a non-in-line system has been developed which uses a multichannel reverberator between the microphones and loudspeakers to provide an increase in reverberation time without requiring an increase in loop gain—see U.S. Pat. No. 5,862,233. It has been shown that the system can both reduce the apparent room absorption (by increasing the loop gain) and increase the apparent room volume (by increasing the reverberation time of the reverberator)—see M. A. Poletti, "The performance of a new assisted reverberation system," *Acta Acustica,* 2 Dec. 1994, pp 511-524. In general, a hybrid room enhancement system may be constructed in which some of the microphones of a non-in-line system containing a reverberator are moved close to the source. In this case the system demonstrates properties of both in-line and non-in-line systems—see M. A. Poletti, "The analysis of a general assisted reverberation system," accepted for publication in *Acta Acustica* vol. 84, pp 766-775, 1998.

When used solely for early reflection enhancement, an in-line system provides a finite number of delayed outputs to simulate early reflections. However, if operated at moderate to high gains, the system runs the risk of instability. This is particularly likely if new delays/reflections are added which will increase the loop gain at some frequencies.

In any sound system, it is important that the direct acoustic sound from the stage arrives at every member of the audience before (or at the same time as) any electroacoustic signal. This is because the perception of localisation is governed by the first signal to arrive at the ears (provided later signals are not overly large). Hence, care must be taken in both in-line and non-in-line systems to ensure that the electroacoustic signals are suitably delayed. In a non-in-line system this can be achieved by keeping the microphones a suitable distance from the stage. Delays can be used in in-line systems and non-in-line systems to avoid preceding the direct sound. Care must therefore be taken in any non-in-line system where microphones are moved close to the stage.

SUMMARY OF INVENTION

In broad terms in one aspect the invention comprises an in-line early reflection generation system comprising:

one or more microphones positioned close to one or more sound sources so as to detect predominantly direct sound;

an early reflection generation stage which generates a number of delayed reproductions of the microphone signals and which has unitary power gain whereby the stability of the system is independent of the delay times and amplitudes;

a number of loudspeakers placed to broadcast the early reflected energy into the room.

The in-line early reflection generation stage may include a number of delay lines which are preceded or followed by cross coupling matrices.

The system and method of the invention do not attempt to optimise the delay time for individual receiver positions as in delta stereophony, nor create wavefronts as in the ACS system. Instead, early reflections are generated in such a way that the stability of the system is maximised. This is achieved by ensuring that the reflection generation circuit has a unitary property.

In the system and method of the invention unitary circuit principles are applied to an in-line reflection generation system. In any early reflection system there is a finite level feedback of sound from the loudspeakers to the microphones via the reverberant field in the room. The generation of multiple reflections via multiple delays and amplitude weightings in prior art early reflection systems increases the risk of instability by creating variations in the loop gain both below and above the levels that would have existed without the system.

However, if the system has a transfer function matrix which is unitary, then the power gain of the system is one at all frequencies, and the stability of the sound system is not compromised by the insertion of the early reflection system.

Suppose the matrix of transfer functions through the early reflection system is X(f). The unitary property states that $$X^H X = I \qquad 1$$

where the H superscript denotes the conjugate transpose of the matrix. Consider a single frequency $f_0$ applied to each input of X, with amplitude $A_n$ and phase $\phi_n$. The input signal $s_{in}(t)$ may be written $$s_{in}(t) = e^{j2\pi f_0 t} u \qquad 2$$

where u is the complex amplitude vector $$u = [A_1 e^{j\phi_1}, A_2 e^{j\phi_2}, \ldots, A_N e^{j\phi_N}]^T \qquad 3$$

The total output power is $$y^H(t)y(t) = u^H X^H(f_0) X(f_0) u = u^H u \qquad 4$$

since X is unitary. Hence, the power gain of a unitary system is one at all frequencies, and does not affect stability when inserted into a multichannel system which contains feedback.

U.S. Pat. No. 5,729,613 describes a multi-channel reverberator which has this unitary property. This device provides multiple channels of reverberation while maintaining a constant power gain with frequency, and is designed for application in a non-in-line system for reverberation time enhancement, as described in U.S. Pat. No. 5,862,233. The device contains multiple channels of internal feedback which creates an infinitely long decaying response, and a rapidly increasing density of echoes which are perceived as reverberation.

In this invention early reflection systems are disclosed which also have a unitary property. They are distinguished from the unitary reverberator in that they do not contain internal feedback, and do not produce an infinite decaying response. Instead they produce a finite response consisting of a relatively low number of discrete echoes. The response is therefore not perceived as reverberation.

It is important to note that in the unitary early reflection system of the invention there is no recursion in the reflection system, ie there is not feedback of the outputs of delay lines to the inputs of delay lines. In contrast to a reverberator the response of the reflection system is therefore finite—the response to an impulse is a short burst of echoes then silence. Also, the density of the echoes will never reach that of a reverberator. Typically system of the invention will have a response time of only 80 ms or so, and the echo density never reaches that of a reverberator.

BRIEF DESCRIPTION OF THE FIGURES

The invention is further described with reference to the accompanying figures, by way of example and without intending to be limiting, in which.

DETAILED DESCRIPTION OF PREFERRED FORMS

Figure 1:
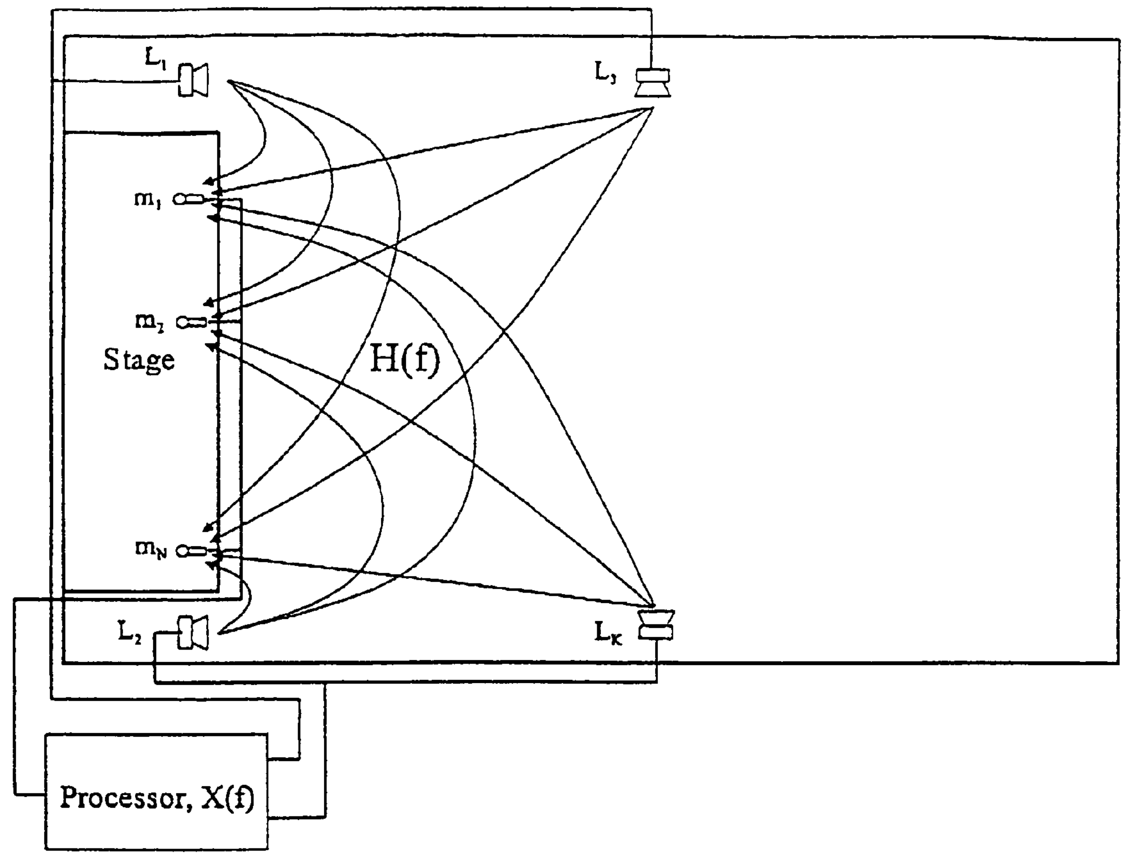
FIG. 1 shows the layout of an early reflection system of the invention.

FIG. 1 shows the layout of an early reflection system of the invention. A number of microphones $m_1$ to $m_N$ are positioned close to the sources on stage. The microphone signals are fed to a processor which generates a number of scaled and delayed replicas of the N microphone signals, and the processor outputs are fed to amplifiers and loudspeakers $L_1$ to $L_K$ placed in the room. The transfer function matrix of the processor is denoted X(f).

The microphones are typically directional, that is, they are sensitive to sound sources positioned on axis, and tend to suppress sound sources (and reflections and reverberation) which are positioned off-axis. This maximises the direct sound pickup and reduces the risk of feedback from the loudspeakers. However, a finite level of feedback may still exist, and if the loop gain of the system is too high, the system will become unstable. The transfer function matrix from the loudspeakers to the microphones is H(f), and the loop transfer function matrix is thus H(f)X(f). If the locus of any eigenfunction of H(f)X(f) encircles the point (1+j0), the system will be unstable.

The stability of the system can be maintained by keeping the loop gain low, for example by keeping the amplifier or microphone preamplifier gains low. However, for a given setting of amplifier gains, the stability of the system is dependent on the particular delay times and delay levels in the processor. Hence, the system stability cannot be guaranteed once the amplifier gains are set. However, if X(f) has a unitary property, its power gain is unity at all frequencies. The stability is then independent of the delay times and levels.

Figure 2:
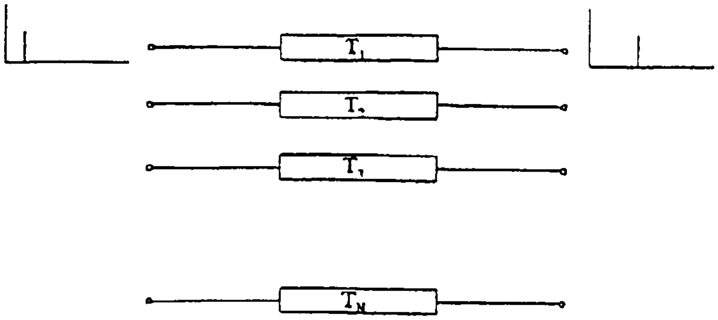
FIG. 2 shows a unitary n-channel delay line system as the early reflection generation stage.

Unitary early reflection systems of the invention may be constructed using non-cross-coupling delay lines and orthonornal cross coupling matrices. The simplest N channel system comprises N delay lines connecting N microphone signals to N loudspeakers, as shown in FIG. 2. This system generates a single delay at each output for a signal applied to its respective input. The transfer function matrix is $$X = D = \begin{bmatrix} \exp\{-j\omega T_1\} & 0 & 0 & 0 \\ 0 & \exp\{-j\omega T_2\} & 0 & 0 \\ 0 & 0 & \exp\{-j\omega T_3\} & 0 \\ 0 & 0 & 0 & \dots \\ 0 & 0 & 0 & \exp\{-j\omega T_N\} \end{bmatrix} \tag{5}$$

This has a diagonal form since there is no cross coupling. The system is unitary since $D^H D = I$.

Figure 3:
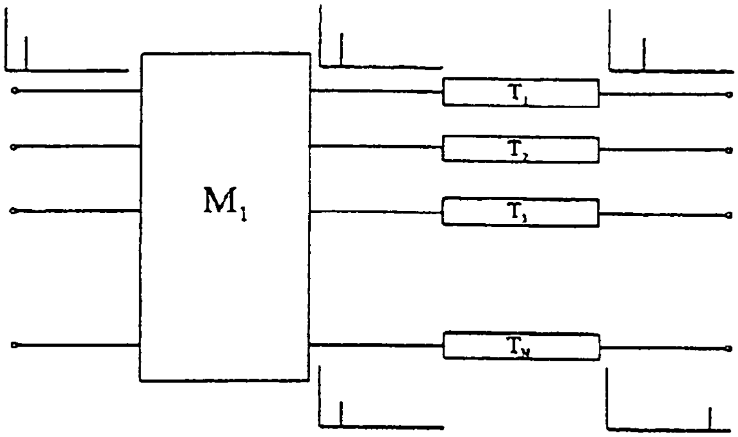
FIG. 3 shows a unitary cross-coupled n-channel delay system including an orthonormal matrix before the delay lines as the early reflection generation stage.

FIG. 3 shows the use of an orthonormal cross coupling matrix in a more complex system of the invention. An orthonormal matrix $M_1$ is placed before the delay lines $T_1$-$T_N$ so that a signal applied to any one input is coupled into every delay line, resulting in a single scaled and delayed reproduction of that signal at every output. The transfer function matrix is $$X = DM_1 \tag{6}$$

This system is unitary since both $M_1$ and D are unitary, and the product of unitary matrices is unitary.

Figure 4:
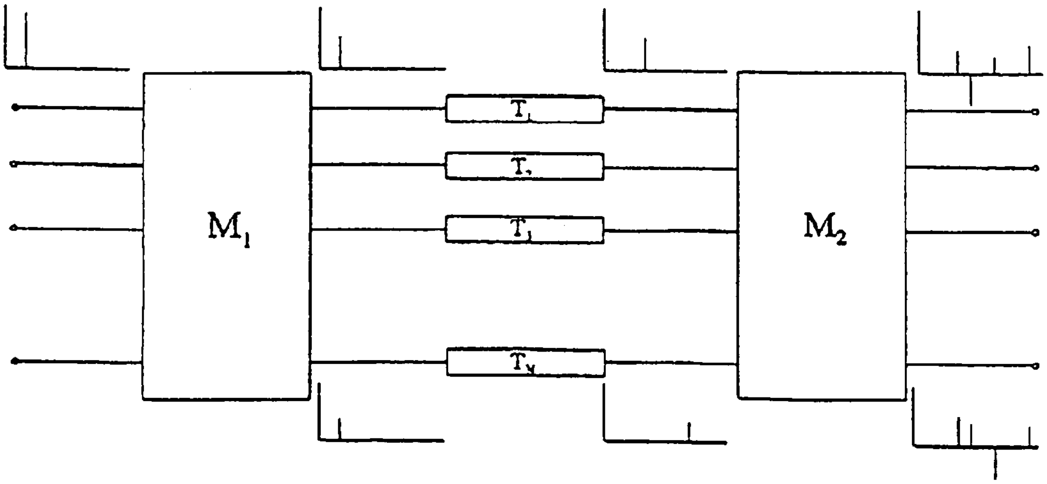
FIG. 4 shows a unitary dual cross-coupled n-channel delay system using orthonormal matrices both before and after the delay lines as the early reflection generation stage.

FIG. 4 shows the use of orthonormal matrices $M_1$ and $M_2$ both before and after the delay lines $T_1$ and $T_N$. A single impulse applied to one of the inputs is applied to all N delay line inputs, and appears at times $\tau_n$ later at the delay outputs. The N delayed impulses are then cross coupled to every output. Thus, N output delays are generated at each output for a single applied impulse. The circuit thus has the property of diffusing the inputs and providing the maximum number of outputs for any input. The matrix transfer function of the circuit is the product of the transfer function matrices of each section $$X = M_2 D M_1 \tag{7}$$

Figure 5:
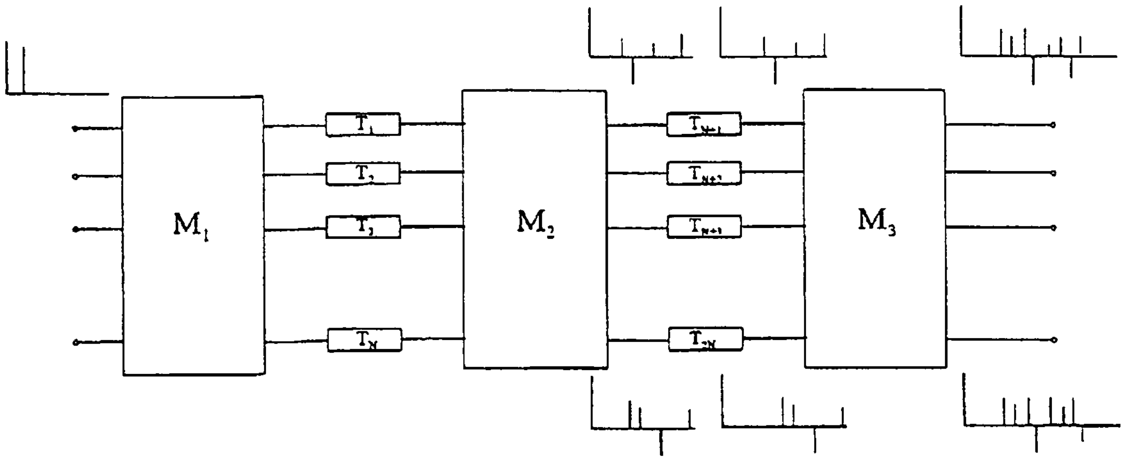
FIG. 5 shows a two stage unitary dual cross-coupled n-channel delay system with cascaded orthonormal matrices and delay lines between each two matrices as the early reflection generation stage.

FIG. 5 shows cascading multiple systems of the form in FIG. 4. This system generates $N^2$ scaled delayed reproductions of a signal applied to any single input at every output. Hence the delay density increases rapidly with the number of delay stages.

Figure 6:
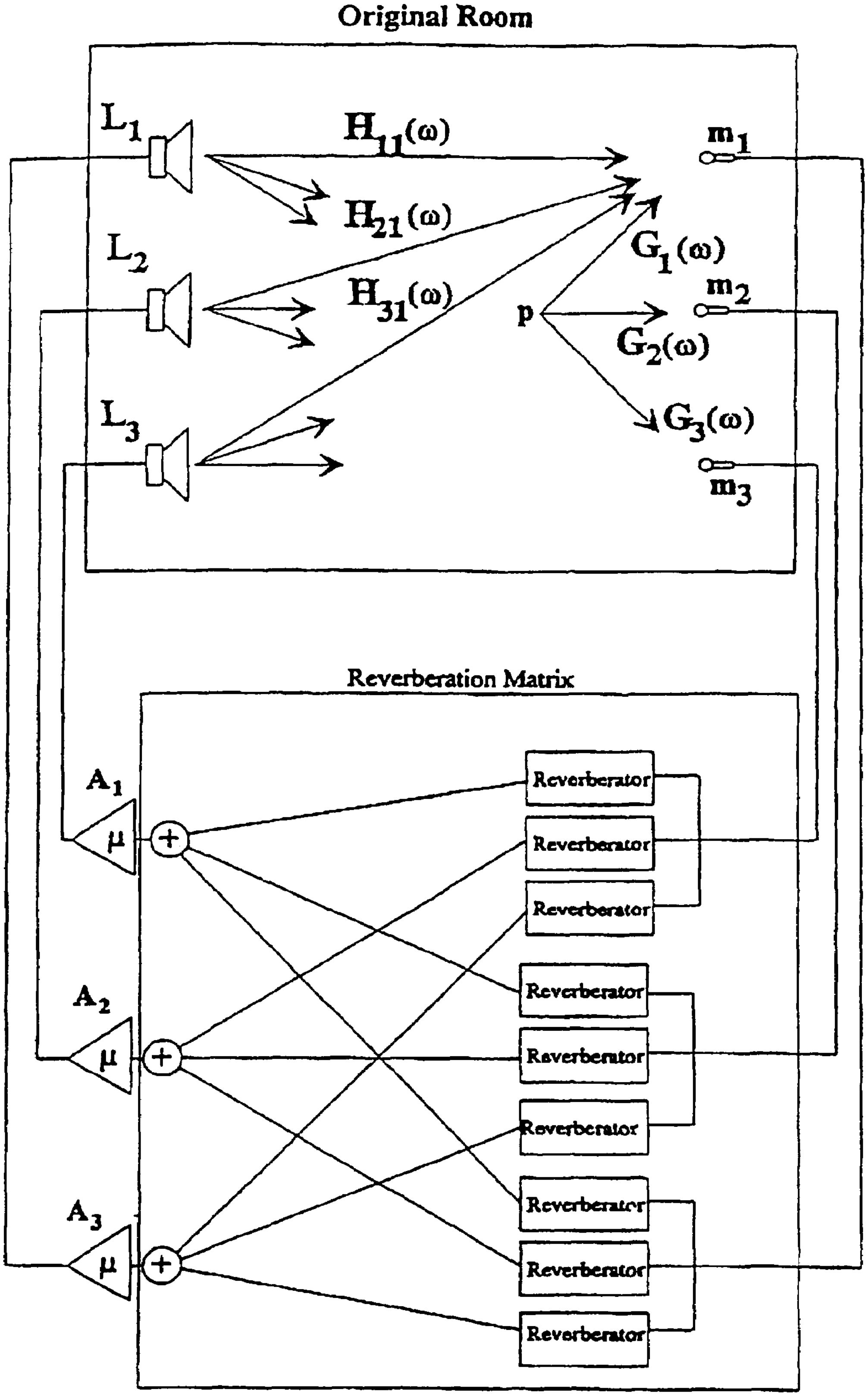
FIG. 6 shows a non-in-line assisted reverberation system for controlling the global reverberation time of a room or auditorium with which the in-line early reflection system of the invention may be combined.

The early reflection enhancement system of the invention may also be combined with a non-in-line assisted reverberation system for controlling the global reverberation time so that the reverberation time is similar for all source positions in the room, of the type described in U.S. Pat. No. 5,862,233. Such a system comprises multiple microphones positioned to pick up predominantly reverberant sound in a room, multiple loud speakers to broadcast sound into the room, and a reverberation matrix connecting a similar bandwidth signal from each microphone through a reverberator having an impulse response consisting of a number of echoes the density of which increases over time, to a loudspeaker. The reverberation matrix may connect a similar bandwidth signal from each microphone through one or more reverberators to two or more separate loudspeakers and each of which receives a signal comprising one or more reverberated microphone signal. FIG. 6 shows a wideband, N microphone, K loudspeaker non-in-line system. Each of microphones, $m_1$, $m_2$ and $m_3$ picks up the reverberant sound in the auditorium. Each microphone signal is split into a number of K of separate paths, and each 'copy' of the microphone signal is transmitted through a reverberator, (the reverberators typically have a similar reverberation time but may have a different reverberation time). Each microphone signal is connected to each of K loudspeakers through the reverberators, with the output of one reverberator from each microphone being connected to each of the amplifiers $A_1$ to $A_3$ and to loudspeakers $L_1$ to $L_3$ as shown ie one reverberator signal from each microphone is connected to each loudspeaker and each loudspeaker has connected to it the signal from each microphone, through a reverberator. In total there are N.K connections between the microphone and the loudspeakers. While in FIG. 6 each microphone signal is split into K separate paths through K reverberators resulting in N.K connections to K amplifiers and loudspeakers, the microphone signals could be split into less than K paths and coupled over less than K reverberators, ie each loudspeaker may have connected to it the signal from at least two microphones each through a reverberator, but be cross-linked with less than the total number of microphones. For example, in the system of FIG. 2 the reverberation matrix may split the signal from each of microphones $m_1$, $m_2$ and $m_3$ to feed two reverberators instead of three, and the reverberator output from microphone mi may then be connected to speakers $L_1$ and $L_3$, from microphone $m_2$ to speakers $L_3$ and $L_2$, and from microphone $m_3$ to speakers $L_2$ and $L_3$. It can be shown that the system performance is governed by the minimum of N and K, and so systems of the invention where N=K are preferred. In FIG. 6 each loudspeaker indicated by $L_1$, $L_2$ and $L_3$ could in fact consist of a group of two or more loudspeakers positioned around an auditorium. In FIG. 6 the signal from the microphones is split prior to the reverberators but the same system can be implemented by passing the supply from each microphone through a single reverberator per microphone and then splitting the reverberated microphone signal to the loudspeakers.

The system simulates placing a secondary room in a feedback loop around the main auditorium with no two-way acoustic coupling. The system allows the reverberation time in the room to be controlled independently of the steady state density by altering the apparent room volume.

The foregoing describes the invention including preferred forms thereof. Alterations and modifications as will be obvious to those skilled in the art are intended to be incorporated within the scope hereof.

The invention claimed is:

1. A processor for providing in-line early reflection enhancement in a sound system, the processor comprising:
- multiple inputs adapted for receiving multiple input signals from one or more microphones positioned close to one or more sound sources within a room or other space so as to detect predominantly direct sound;
- an early reflection generation stage which has a finite impulse response and which without internal feedback generates a number of delayed discrete reproductions of the input signals, the early reflection generation stage comprising at least one cross-coupling matrix which is an orthonormal cross-coupling matrix, and the early reflection generation stage having a unitary transfer function matrix such that the processor has an overall power gain that is constant with frequency to improve stability in the sound system, whereby the stability of the sound system in relation to said delayed discrete reproductions of the microphone signals is independent of delay times and amplitudes in the early reflection generation stage; and
- multiple outputs adapted for outputting the delayed discrete reproductions of the microphone signals to a number of loudspeakers placed to broadcast said delayed discrete reproductions of the microphone signals into the room or other space.

2. The processor according to claim 1 wherein the early reflection generation stage includes a series connection of two or more cross-coupling matrices with a set of delay lines positioned between the two matrices.

3. The processor according to claim 2 wherein said two or more cross-coupling matrices are orthonormal matrices.

4. The processor according to claim 1 wherein each input is coupled to every output to provide a maximisation of diffusion of the input signals to all of the outputs.

5. The processor according to claim 1 in combination with a wideband non-in-line assisted reverberation system which increases apparent room volume, including multiple loudspeakers to broadcast sound into the room, and a reverberation matrix connecting a similar bandwidth signal from each microphone through one or more reverberators having an impulse response consisting of a number of echoes the density of which increases over time, to one or more loudspeakers.

6. The processor according to claim 5 wherein in said wideband non-in-line assisted reverberation system the reverberation matrix connects a similar bandwidth signal from each microphone through one or more reverberators to at least two loudspeakers each of which receives a signal comprising a sum of at least two reverberated microphone signals.

7. A method for enhancing the acoustics of a room or auditorium using a processor for providing in-line early reflection enhancement in a sound system, the sound system, the processor having multiple inputs adapted for receiving multiple input signals form one or more microphones, an early reflection generation stage, and multiple outputs adapted for outputting signals to a number of loud speakers placed to broadcast into the room or auditorium, the method comprising detecting predominantly direct sound with the one or more microphones positioned close to one or more sound sources and providing multiple input signals, generating a number of delayed discrete reproductions of the input signals in the early reflection generation stage having a finite impulse response and without internal feedback, whereby the early reflection generation stage comprises at least one cross-coupling matrix which is an orthonormal cross-coupling matrix wherein the early reflection generation stage has a unitary transfer function matrix such that an overall power gain of the processor is constant with frequency to improve stability in the sound system; and whereby the stability of the sound system in relation to the delayed discrete reproductions of the microphone signals is independent of delay times and amplitudes, and outputting the delayed discrete reproductions of the microphone signals for input to the number of loudspeakers to broadcast said delayed discrete reproductions of the input signals into the room.

8. The method according to claim 7 wherein the early reflection generation stage includes a series connection of two or more cross-coupling matrices with a set of delay lines position between the two matrices.

9. The method according to claim 8 wherein said two or more cross-coupling matrix or matrices are orthonormal matrices.

10. A method according to claim 7 wherein each input is coupled to every output to provide a maximisation of diffusion of the input signals to all of the outputs.

11. A processor for providing in-line early reflection enhancement in a sound system, the processor comprising:
- multiple inputs adapted for receiving multiple input signals from one or more microphones positioned close to one or more sound sources within a room or other space so as to detect predominantly direct sound;
- an early reflection generation stage which has a finite impulse response and which without internal feedback generates a number of delayed discrete reproductions of the input signals and which, the early reflection generation stage comprising a series connection of two or more cross-coupling matrices which are orthonormal cross-coupling matrices with a set of delay lines positioned between the matrices, and the early reflection generation stage having a a unitary transfer function matrix such that the processor has an overall power gain that is constant with frequency to improve stability in the sound system, whereby the stability of the sound system in relation to said delayed discrete reproductions of the microphone signals is independent of delay times and amplitudes in the early reflection generation stage; and
- multiple outputs adapted for outputting the delayed discrete reproductions of the microphone signals to a number of loudspeakers placed to broadcast said delayed discrete reproductions of the microphone signals into the room or other space.

12. The processor according to claim 11 wherein each input is coupled to every output to provide a maximisation of diffusion of the input signals to all of the outputs.

13. The processor according to claim 11 in combination with a wideband non-in-line assisted reverberation system which increases apparent room volume, including multiple loudspeakers to broadcast sound into the room, and a reverberation matrix connecting a similar bandwidth signal from each microphone through one or more reverberators having an impulse response consisting of a number of echoes the density of which increases over time, to one or more loudspeakers.

14. The processor according to claim 13 wherein in said wideband non-in-line assisted reverberation system the reverberation matrix connects a similar bandwidth signal from each microphone through one or more reverberators to at least two loudspeakers each of which receives a signal comprising a sum of at least two reverberated microphone signals.

15. A method for enhancing the acoustics of a room or auditorium using a processor for providing in-line early reflection enhancement in a sound system, the processor having multiple inputs adapted for receiving multiple input signals from one or more microphones, an early reflection generation stage and multiple outputs adapted for outputting signals to a number of loud speakers placed to broadcast into the room or auditorium, the method comprising detecting predominantly direct sound with the one or more microphones positioned close to one or more sound sources and providing multiple input signals, generating a number of delayed discrete reproductions of the input signals in an early reflection generation stage having a finite impulse response and without internal feedback, whereby the early reflection generation stage comprises a series connection of two or more cross-coupling matrices which are orthonormal matrices with a set of delay lines positioned between the matrices, and wherein the early reflection generation stage has a unitary transfer function matrix that provides an overall power gain that is constant with frequency to improve stability in the sound system; and whereby the stability of the sound system in relation to the delayed discrete reproductions of the microphone signals is independent of delay times and amplitudes; and outputting the delayed discrete reproductions of the microphone signals for input into the number of loud speakers to broadcast said delayed discrete reproductions of the input signals into the room.

16. The method according to claim 15 wherein each input is coupled to every output to provide a maximisation of diffusion of the input signals to all of the outputs.

* * * * *